(12) United States Patent
Wilcox et al.

(10) Patent No.: US 7,915,916 B2
(45) Date of Patent: Mar. 29, 2011

(54) ANTIFUSE PROGRAMMING CIRCUIT WITH SNAPBACK SELECT TRANSISTOR

(75) Inventors: William J. Wilcox, Meridian, ID (US);
James C. Davis, Boise, ID (US);
Dwayne K. Kreipl, Boise, ID (US);
Michael B. Pearson, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 92 days.

(21) Appl. No.: 11/421,614

(22) Filed: Jun. 1, 2006

(65) Prior Publication Data

US 2007/0279086 A1 Dec. 6, 2007

(51) Int. Cl.
*G06F 7/38* (2006.01)
*H03K 19/173* (2006.01)
*H03K 19/094* (2006.01)
*G11C 17/00* (2006.01)
*G11C 17/18* (2006.01)

(52) U.S. Cl. ........... 326/38; 365/96; 365/225.7; 326/37; 326/49

(58) Field of Classification Search ............ 326/38, 326/39; 365/49.12
See application file for complete search history.

(56) References Cited

U.S. PATENT DOCUMENTS

| | | | | |
|---|---|---|---|---|
| 3,744,036 A * | 7/1973 | Frohman-Bentchkowsky | | 365/185.18 |
| 4,899,205 A * | 2/1990 | Hamdy et al. | | 257/530 |
| 5,148,391 A * | 9/1992 | Zagar | | 365/96 |
| 5,163,180 A * | 11/1992 | Eltoukhy et al. | | 257/530 |
| 5,257,222 A * | 10/1993 | Lee | | 365/96 |
| 5,293,339 A * | 3/1994 | Suzuki et al. | | 365/200 |
| 5,311,472 A * | 5/1994 | Ota | | 365/200 |
| 5,621,691 A * | 4/1997 | Park | | 365/200 |
| 5,627,779 A * | 5/1997 | Odake et al. | | 365/185.01 |
| 5,675,547 A * | 10/1997 | Koga | | 365/230.03 |
| 5,689,463 A * | 11/1997 | Murakami et al. | | 365/200 |
| 5,696,723 A * | 12/1997 | Tukahara | | 365/200 |
| 5,724,282 A * | 3/1998 | Loughmiller et al. | | 365/96 |
| 5,801,574 A * | 9/1998 | Martin et al. | | 327/525 |
| 5,909,049 A * | 6/1999 | McCollum | | 257/530 |
| 6,008,665 A * | 12/1999 | Kalb et al. | | 326/30 |
| 6,240,033 B1* | 5/2001 | Yang et al. | | 365/225.7 |
| 6,252,293 B1* | 6/2001 | Seyyedy et al. | | 257/530 |
| 6,346,828 B1* | 2/2002 | Rosen et al. | | 326/56 |
| 6,424,161 B2* | 7/2002 | Damon et al. | | 324/550 |
| 6,448,830 B1* | 9/2002 | Chuang et al. | | 327/205 |
| 6,671,040 B2* | 12/2003 | Fong et al. | | 365/189.08 |
| 6,686,791 B2* | 2/2004 | Zheng et al. | | 327/525 |
| 6,713,839 B2* | 3/2004 | Madurawe | | 257/530 |
| 7,167,397 B2* | 1/2007 | Paillet et al. | | 365/185.28 |
| 7,269,081 B2* | 9/2007 | Ito | | 365/189.09 |
| 7,280,425 B2* | 10/2007 | Keshavarzi et al. | | 365/225.7 |
| 7,349,281 B2* | 3/2008 | Kouchi et al. | | 365/225.7 |
| 7,402,855 B2* | 7/2008 | Kurjanowicz | | 257/288 |
| 7,511,982 B2* | 3/2009 | Kurjanowicz et al. | | 365/96 |
| 2002/0167831 A1* | 11/2002 | Mullarkey et al. | | 365/96 |
| 2002/0181315 A1* | 12/2002 | Lee et al. | | 365/230.06 |
| 2003/0169095 A1* | 9/2003 | Kothandaraman | | 327/525 |

(Continued)

*Primary Examiner* — James H. Cho
*Assistant Examiner* — Matthew C. Tabler
(74) *Attorney, Agent, or Firm* — Dorsey & Whitney LLP

(57) ABSTRACT

An antifuse circuit includes a terminal, an antifuse, and a select transistor. The antifuse is coupled to the terminal and has an associated program voltage. The select transistor is coupled to the antifuse and has a gate terminal coupled to receive a first select signal. The select transistor operates in a snapback mode of operation in response to an assertion of the first select signal and the program voltage at the terminal.

10 Claims, 4 Drawing Sheets

U.S. PATENT DOCUMENTS

| | | | |
|---|---|---|---|
| 2003/0201819 A1* | 10/2003 | Zheng et al. | 327/525 |
| 2004/0113664 A1* | 6/2004 | Kwon | 327/112 |
| 2004/0213056 A1* | 10/2004 | Fujima | 365/200 |
| 2005/0013169 A1* | 1/2005 | Tanaka et al. | 365/185.22 |
| 2005/0024974 A1* | 2/2005 | Noguchi et al. | 365/230.03 |
| 2005/0030425 A1* | 2/2005 | Nagakura et al. | 348/553 |
| 2005/0057997 A1* | 3/2005 | Mitani et al. | 365/222 |
| 2005/0201135 A1* | 9/2005 | Mullarkey et al. | 365/96 |

* cited by examiner

ANTIFUSE PROGRAMMING CIRCUIT WITH SNAPBACK SELECT TRANSISTOR

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to integrated circuits and, more particularly, to an antifuse programming circuit with a snapback select transistor.

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of the fabricated memory device. Fusible elements may also be used to customize the configuration of a generic integrated circuit after it is fabricated, or to identify an integrated circuit.

One type of fusible element is a polysilicon fuse. The polysilicon fuse comprises a polysilicon conductor fabricated to conduct electrical current on an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is encapsulated in any manner.

Another type of fusible element is an antifuse. An antifuse includes two conductive terminals separated by an insulator or a dielectric, and is fabricated as an open circuit. The antifuse is programmed by applying a high voltage across its terminals to rupture the insulator and form an electrical path between the terminals. Another type of antifuse may be implemented using a transistor. Under high voltage, the gate dielectric layer ruptures, causing a short to substrate. In either case, the electrical path created by programming the antifuse can later be detected and used as the basis for configuring the device.

Antifuses have several advantages that are not available with typical fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are typically not at risk when one is being programmed. Antifuses may also be programmed after an integrated circuit is placed in an integrated circuit package, or encapsulated, by applying appropriate signals to pins of the package. This is a significant advantage over polysilicon fuses for several reasons. An integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits, because the same generic integrated circuit may be produced to meet the needs of a wide variety of customers.

An exemplary antifuse programming circuit 100 is shown in FIG. 1. The antifuse programming circuit includes a programming terminal 105 to which an external programming voltage is applied for programming an antifuse 110. The antifuse is coupled to an isolation transistor 115 and a select transistor 120. The isolation transistor 115 provides voltage isolation due to the relatively high programming voltage required to program the antifuse 110 thereby protecting other circuit elements from damage (e.g., the select transistor 120). The isolation transistor 115 only passes its gate voltage minus a threshold voltage to its source.

The application of the program voltage ruptures the dielectric of the antifuse 110, creating a conductive path through the transistors 115, 120. After the initial rupture, the program voltage is applied for a specified time interval to allow current to flow through the antifuse 110 thereby reducing the resistance of the conductive path through the antifuse 110. This specified time interval is commonly referred to as a soak interval. The level of soak current required to program the antifuse 110 and provide a reliable restive path is typically significant.

Although antifuses are typically more compact than other types of fusible elements, such as polysilicon fuses, they still consume an appreciable amount of real estate on the semiconductor device. With reference to FIG. 1, because the transistors 115, 120 must have sufficient current ratings to conduct the soak current, they are typically relatively large transistors. When the relatively large size is accumulated over the number of transistors 115, 120 needed to support a bank of antifuses, the amount of real estate consumed is significant.

This section is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the issues set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in an antifuse circuit including a terminal, an antifuse, and a select transistor. The antifuse is coupled to the terminal and has an associated program voltage. The select transistor is coupled to the antifuse and has a gate terminal coupled to receive a first select signal. The select transistor operates in a snapback mode of operation in response to an assertion of the first select signal and the program voltage at the terminal.

Another aspect of the present invention is seen in an antifuse circuit including a terminal, a disconnect transistor, and a select transistor. The disconnect transistor is coupled to the terminal and has a gate terminal coupled to receive a first select signal. The antifuse is coupled to the disconnect transistor and has an associated program voltage. The select transistor is coupled to the antifuse and has a gate terminal coupled to receive a second select signal. The select transistor has a first breakdown voltage less than the program voltage.

Yet another aspect of the present invention includes a method for programming an antifuse. The method includes providing a first transistor enabled responsive to a first select signal coupled to a terminal, a first antifuse coupled to the first transistor, and a second transistor enabled responsive to a second select signal coupled to the first antifuse. The second transistor has a breakdown voltage less than a program voltage associated with the first antifuse. A program voltage is provided at the terminal. The first and second select signals are asserted to program the first antifuse. The second transistor operates in a snapback mode of operation during at least a portion of the programming of the first antifuse. The first select signal is deasserted to isolate the second transistor from the program voltage following the programming of the first antifuse.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
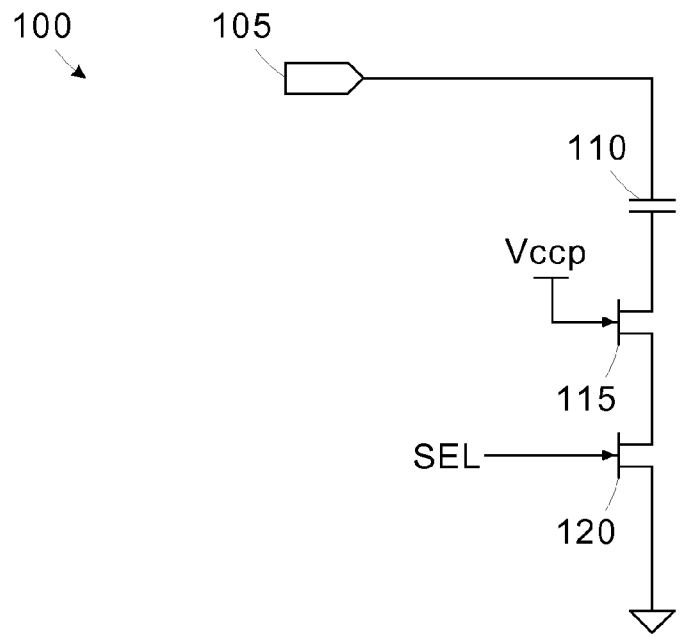
FIG. 1 is diagram of an exemplary prior art antifuse programming circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
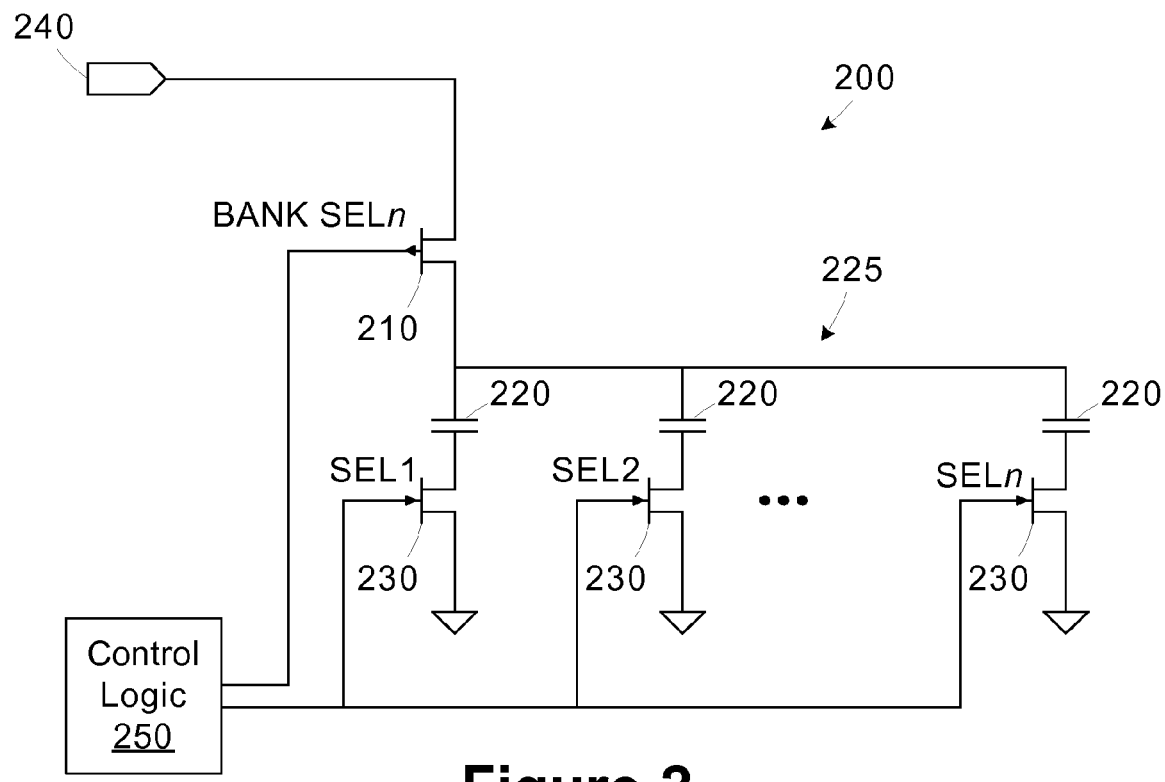
FIG. 2 is a diagram of an antifuse programming circuit in accordance with one illustrative embodiment of the present invention.

Referring now to the drawings wherein like reference numbers correspond to similar components throughout the several views and, specifically, referring to FIG. 2, the present invention shall be described in the context of an exemplary antifuse circuit 200. The antifuse circuit 200 includes a disconnect transistor 210, a plurality of antifuses 220, and a select transistor 230 associated with each of the antifuses 220. In the illustrated embodiment, the disconnect transistor 210 is a p-channel device, and the select transistors 230 are n-channel devices. Of course other types of transistors may be used depending on the particular embodiment.

The disconnect transistor 210 is coupled between a terminal 240 and the antifuses 220 for selectively applying a voltage to an antifuse 220 selected for programming by its associated select transistor 230. For example, the terminal 240 may be an external pin of the device with which the antifuse circuit 200 is associated. Control logic 250 is provided for generating various select signals for programming the antifuses 220. For example, a program voltage may be applied to the terminal 240, and the disconnect transistor 210 may be selected by asserting the BANK SEL signal. The appropriate select transistor 230 may be enabled by asserting the SEL signal to select the particular one of the antifuses 220 to be programmed. Although the antifuses 220 are illustrated as being plate-type antifuses, the application of the present invention is not so limited, and the antifuses 220 may be of the transistor type as well.

The antifuse circuit 200 is illustrated as having one disconnect transistor 210 to service a bank 225 of antifuses 220. Generally, the disconnect transistor 210 is provided for isolating the bank 225 from the program voltage at the terminal 240 between program events. It is contemplated that in some embodiments, each antifuse 220 may have its own disconnect transistor 210. The n designations on the BANK SEL and SEL signals indicate that multiple banks 225 and multiple select signals may be provided.

The disconnect transistor 210 and select transistors 230 are designed and fabricated such that the select transistor 230 enters a snapback mode of operation after the initial rupture of the antifuse 220, while the disconnect transistor 210 remains in a normal mode of operation. In a snapback mode of operation the select transistor 230 exhibits increased current conduction with a given applied voltage, as compared to a transistor operating in the normal mode below the breakdown voltage. Generally, this increased current conduction mode allows the select transistor 230 to conduct sufficient soak current to perfect the programming of the antifuse 220 without requiring an increased device size. Hence, the select transistors 230 consume less real estate on the semiconductor device, as compared to the space that would be required for transistors sized to carry the same amount of soak current in a normal mode of operation.

The relative breakdown voltages of the disconnect transistor 210 and the select transistor 230 are tailored to achieve the desired snapback mode of operation for the select transistor 230. For example, if the program voltage associated with the antifuse is approximately 5V, the breakdown voltage of the select transistor 230 may be approximately 4-4.5V. In the illustrated embodiment, the disconnect transistor 210 is a p-channel device with essentially conventional p-channel implants. However, the n-channel select transistor 230 is provided with a sharper n+/p− sub junction at its drain to decrease the breakdown voltage and encourage avalanche breakdown and thus snapback. This sharper junction may be formed using a locally higher n-type implant or a locally higher p-type implant (or both) at the drain. For example, a halo implant may be performed at the drain to achieve this characteristic. In either case (i.e., more n-type or more p-type), the implant is conducted with sufficient energy to be located at the n+/p− sub junction (i.e., it is not a surface implant).

Figure 3:
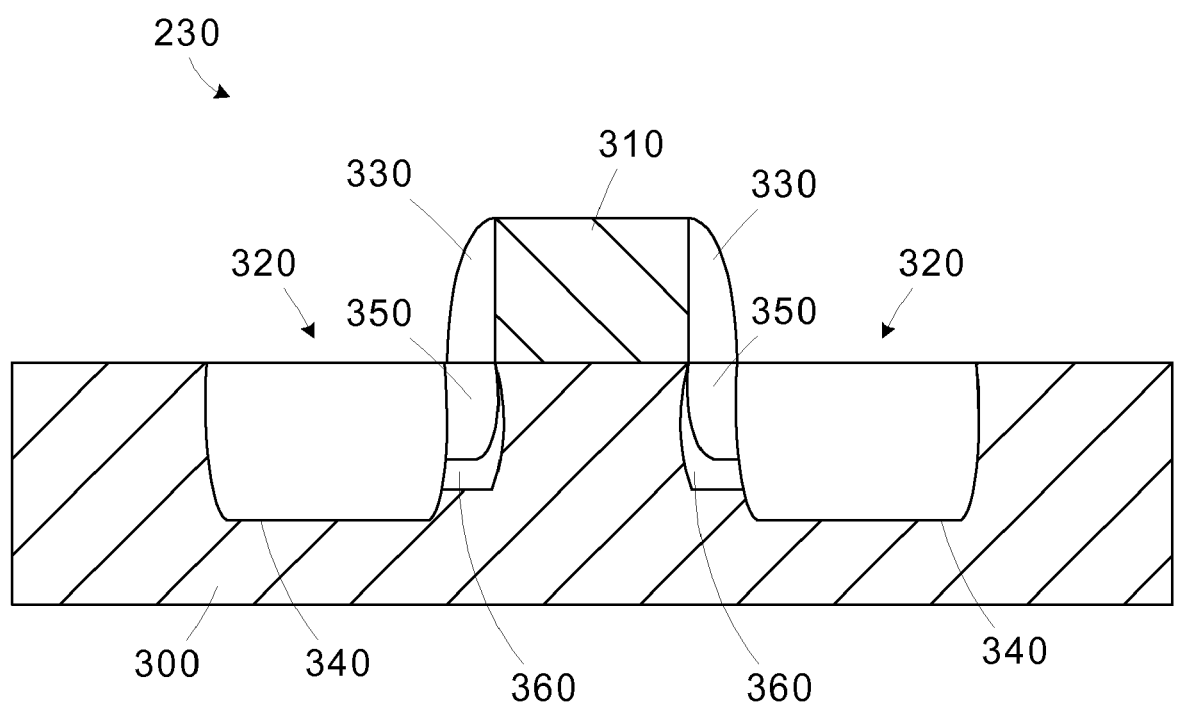
FIG. 3 is a cross-section view of an exemplary select transistor in the antifuse circuit of FIG. 2.

Turning briefly to FIG. 3, a simplified diagram of an exemplary select transistor 230 is provided to illustrate the tailoring of the breakdown voltage. The select transistor 230 is formed on a substrate 300 (e.g., P type). A gate 310 is formed on the substrate 300. For brevity, and to avoid obscuring the present invention, not all features of the gate 310 are shown. Typically, the gate 310 includes a gate oxide layer formed over the substrate 300, a conductive layer over the gate oxide, and an insulative layer over the conductive layer. The conductive and insulative layers may each include more than one layer. For example, the conductive layer may include a polysilicon layer covered by a silicide layer, and the insulative layer may include an oxide layer covered by a nitride cap layer. Various gate 310 embodiments may be used, and their specific constructs are well known to those of ordinary skill in the art.

As seen in FIG. 3, source/drain regions 320 are formed in the substrate 300 using one or more implantation steps, as is well known in the art. Spacers 330 may be used to tailor the profile of the source/drain regions 320. Of course, multiple spacers of differing sizes may be used, or spacers may be omitted entirely, to tailor the source/drain regions 320 as desired. In the example construction of FIG. 3, the source/drain regions 320 include a highly-doped region 340, a lightly-doped region 350, and a halo region 360. To sharpen the n+/p− sub junction (e.g., between the source/drain region 320 and the substrate 300), the halo region 360 may be formed using a p-type dopant.

Returning to FIG. 2, the disconnect transistor 210 is controlled to disconnect the select transistor 230 from the terminal 240 after a programming event, thereby isolating the select transistor 230 from the program voltage to allow the select transistor 230 to exit from snapback mode without requiring the cycling of the program voltage. In this manner a programming event that programs multiple antifuses 220 in the bank 225 may be conducted by cycling the disconnect transistor 210, not by cycling the program voltage, thereby reducing the time required for the programming event.

In the illustrated embodiment, the antifuses 220 are programmed using a voltage of approximately 4-5 volts. In other embodiments, the antifuses 220 may require a higher program voltage (e.g., 7-8) volts. In such a case, the antifuse circuit 200 may include isolation transistors, such as the isolation transistor 115 of FIG. 1 disposed between the antifuse 220 and the select transistor 230. Even with the addition of isolation transistors 115, the real estate consumed by the antifuse circuit 200 is less than a conventional circuit due to the size savings associated with the select transistors 230.

Figure 4:
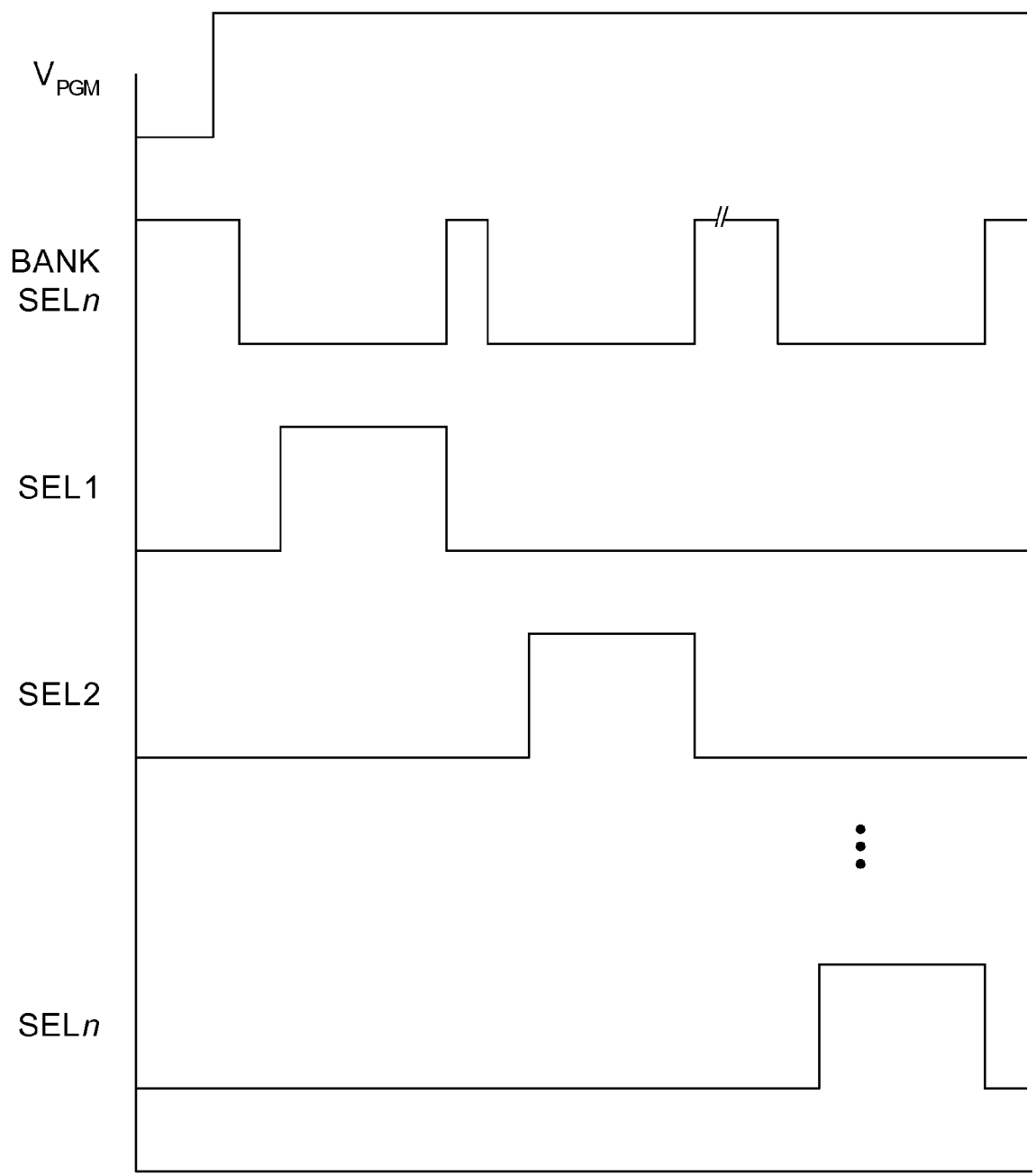
FIG. 4 is a timing diagram illustrating the timing of select signals for programming the antifuse circuit of FIG. 2.

Turning now to FIG. 4, a timing diagram showing the control signal provided for programming selected antifuses 220 in the bank 225 is provided. The program voltage $V_{PGM}$ is asserted at the terminal 240 to initiate the programming operation. The BANK SEL signal is asserted to select the bank 225. The SEL1 signal is asserted to select a first select transistor 230 and its associated antifuse 220. The select transistor 230 enters a snapback mode of operation following the rupture of the antifuse 220 to provide increased soak current. The SEL1 and BANK SEL signal are deasserted following a predetermined time interval to allow the select transistor 230 to exit the snapback state.

Subsequently, the bank 225 is selected again by asserting the BANK SEL signal, and a second select transistor 230 is enabled by asserting an SEL2 signal. Once again, the SEL2 and BANK SEL signal are deasserted following the programming of the antifuse 220 to allow the select transistor 230 to exit the snapback state.

The length of the predetermined program time interval depends on the particular characteristics of the antifuse circuit 200, including the program voltage, the time required to rupture the antifuse 220, and the soak time required to perfect the antifuse 220. Likewise, the particular time intervals between assertions of the BANK SEL signal and the time the BANK SEL signal remains deasserted to allow the select transistor 230 to exit snapback mode depend on the particular implementation and device characteristics. The time intervals illustrated are merely intended to be illustrative of the programming sequence, not the actual relative timing or time periods.

Figure 5:
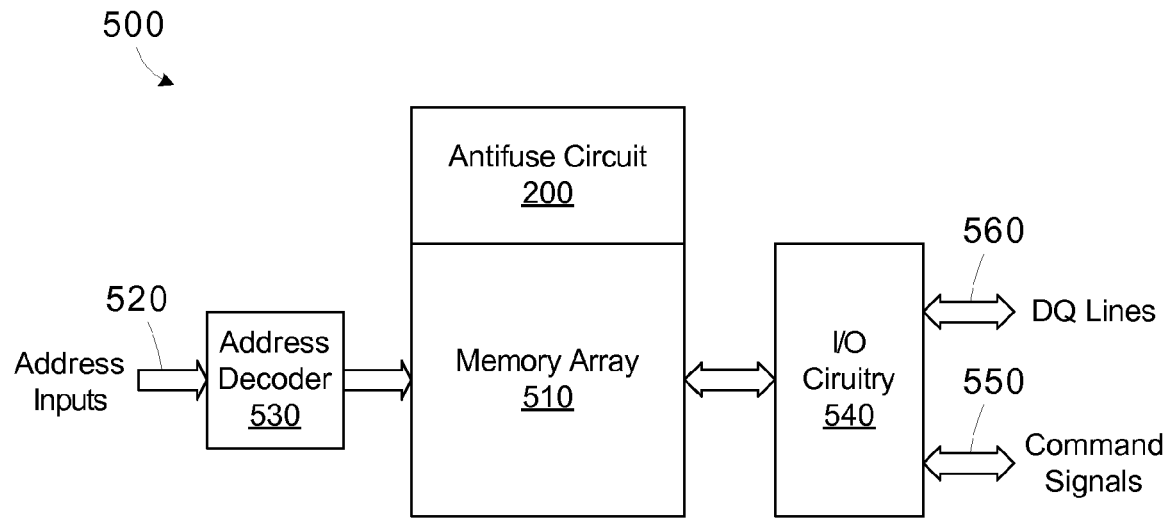
FIG. 5 is a simplified functional block diagram of a memory device incorporating the antifuse circuit of FIG. 2.

Referring now to FIG. 5, a block diagram of a memory device 500 is shown according to another embodiment of the present invention. The memory device 500 includes an array 510 of memory cells that are accessed according to address signals provided to the memory device 500 at a number of address inputs 520. An address decoder 530 decodes the address signals and accesses memory cells in the array 510 according to the address signals. Input/output (I/O) circuitry 540 is provided for controlling read and write events to the memory array 510 in the locations specified by the address inputs 520. Control inputs 550 are provided for defining the type of transaction being conducted (e.g., typical control inputs 550 include a chip enable signal, a write enable signal, and an output enable signal) DQ lines 560 are provided for the exchange of read or write data with the memory array 510. For example, data is written to the memory cells in the array 510 when a write enable signal and a chip enable signal are both low. The data is received by the memory device 500 over the DQ lines 560. The data is provided to the memory cells in the array 510 from the DQ lines 560 through the I/O circuitry 540. Data is read from the memory cells in the array 510 when the write enable signal is high and the output enable signal and the chip enable signal are both low.

The antifuse circuit 200 may be used in the memory device 500 for configuring the memory array 510. For example, defective memory cells may be replaced with redundant cells by programming certain antifuses 220, as is well known in the art. The antifuse circuit 200 may be integrated with the memory array 510 or may be a separate circuit on the memory device 500.

Figure 6:
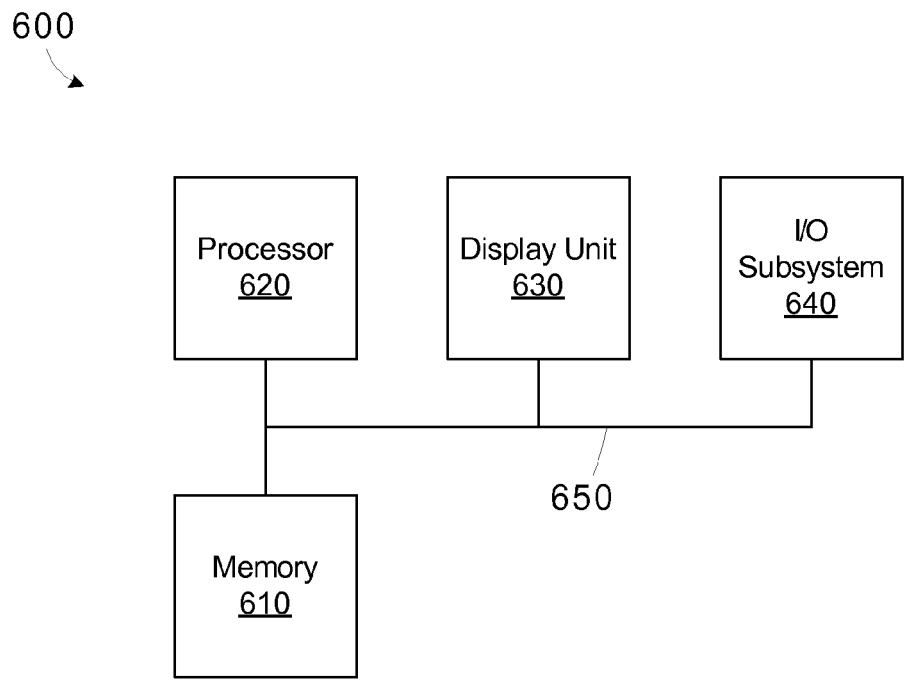
FIG. 6 is a simplified block diagram of an information handling system incorporating the antifuse circuit of FIG. 2.

A block diagram of an information-handling system 600 is shown in FIG. 6 according to yet another embodiment of the present invention. The information-handling system 600 includes a memory system 610, a processor 620, a display unit 630, and an I/O subsystem 640. The processor 620, the display unit 630, the I/O subsystem 640, and the memory system 610 are coupled together by a suitable communication line or bus 650 over which signals are exchanged between them. The processor 620 may be, for example, a microprocessor. One or more of the memory system 610, the processor 620, the display unit 630, and the I/O subsystem 640 may include one or more of the circuits and devices described above with respect to FIGS. 1-5 according to embodiments of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. An antifuse circuit fabricated on a semiconductor substrate, comprising:
   a terminal; a program voltage coupled to the terminal; a plurality of antifuses fabricated on the semiconductor substrate; a disconnect transistor fabricated on the semiconductor substrate and coupled between the terminal and a programming node and having a gate terminal coupled to receive a first select signal, the disconnect transistor having an associated breakdown voltage that is greater than the program voltage;
   a plurality of select transistors fabricated on the semiconductor substrate, each of the select transistors being coupled in series with a respective one of the antifuses between the programming node and a voltage node and having a gate terminal coupled to receive a respective second select signal, each of the select transistors having an associated breakdown voltage that is less than the program voltage and being operable to operate in the snapback mode of operation responsive to an assertion of the first select signal and the respective second select signal; and
   control logic fabricated on the semiconductor substrate and operable to sequentially assert the second select signals to program the respective antifuses, to assert the first select signal when each of the second select Signals is asserted and to deassert the first select signal after the programming of each of the antifuses to isolate the select transistor from the terminal.

2. The circuit of claim 1 wherein the voltage node comprises ground potential.

3. The circuit of claim 1 wherein the disconnect transistor comprises a p-channel transistor, and at least one of the plurality of select transistors comprises an n-channel transistor.

4. The circuit of claim 1 wherein the control logic is operable to sequentially assert the second select signal coupled to each of the select transistors, and to assert the first select signal coupled to the gate of the disconnect transistor during at least the entire period that one of the second select signals is being coupled to the gate of a respective one of the select transistors to program the respective antifuse to which the select transistor is coupled, the control logic being operable to deassert the first select signal after programming each of the antifuses to isolate the antifuses from the terminal.

5. A method for programming a plurality of antifuses fabricated on a semiconductor substrate, comprising:
   providing a plurality of first transistors fabricated on the semiconductor substrate, each of the first transistors being connected in series with a respective one of the antifuses between a program node and a voltage node, each of the first transistors being enabled responsive to a respective first select signal, each of the first transistors having a breakdown voltage that is less than a program voltage associated with the respective antifuse to which the first transistor is connected;
   providing a second transistor fabricated on the semiconductor substrate connected between the program node and a terminal, the second transistor being enabled responsive to a second select signal, the second transistor having an associated breakdown voltage that is greater than the program voltage; providing the program voltage at the terminal;
   asserting each of the first select signals in sequence and asserting the second select signal to program the antifuses, each of the first transistors operating in a snapback mode of operation during at least a portion of the programming of the respective antifuse; and
   deasserting the second select signal to isolate the second transistor from the program voltage following the programming of at least one of the antifuses.

6. The method of claim 5, further comprising providing the program voltage without interruption during the asserting and deasserting of the first select signal.

7. A memory device, comprising: an array of memory cells;
   an address decoder operable to decode address signals to access the memory cells;
   a plurality of input/output lines operable to couple data to the memory cells;
   input/output circuitry operable to control the data on the input/output lines based on command signals; and
   an antifuse circuit fabricated on a semiconductor substrate and integrated into the array, the antifuse circuit comprising:
   a terminal;
   a program voltage coupled to the terminal;

a disconnect transistor coupled to the terminal and having a gate terminal coupled to receive a first select signal, the disconnect transistor being fabricated on the semiconductor substrate and having an associated breakdown voltage that is greater than the program voltage;

a plurality of antifuses fabricated on the semiconductor substrate;

a plurality of select transistors fabricated on the semiconductor substrate, each of the select transistors being coupled in series with at least a respective one of the antifuses between the disconnect transistor and a voltage node, each of the select transistors having a gate terminal coupled to receive a respective second select signal, the select transistors having a first breakdown voltage less than the program voltage; and control logic fabricated on the semiconductor substrate and operable to sequentially assert each of the second select signals associated with the respective select transistors to program the antifuses, to assert the first select signal when each of the second select signals is asserted, and to deassert the first select signal after programming each of the antifuses.

8. The device of claim 7, wherein the control logic is operable to program the plurality of antifuses without requiring removal of the program voltage at the terminal.

9. A system, comprising:

a memory system;

a processor;

an input/output subsystem; and a communication line coupling the memory system, processor, and input/output subsystem, wherein at least one of the memory system, processor, and input/output subsystem includes an antifuse circuit fabricated on a semiconductor substrate, the antifuse circuit comprising:

a terminal;

a program voltage coupled to the terminal; a disconnect transistor coupled to the terminal and having a gate terminal coupled to receive a first select signal, the disconnect transistor being fabricated on the semiconductor substrate and having an associated breakdown voltage that is greater than the program voltage;

a plurality of antifuses fabricated on the semiconductor substrate and being coupled to the disconnect transistor;

a plurality of select transistors fabricated on the semiconductor substrate, each of the select transistors being coupled to at least a respective one of the plurality of antifuses and having a gate terminal coupled to receive a respective second select signal, the select transistors having a first breakdown voltage less than the program voltage; and control logic fabricated on the semiconductor substrate and operable to sequentially assert each of the second select signals associated with the respective select transistors to program the antifuses, to assert the first select signal when each of the second select signals is asserted, and to deassert the first select signal after programming each of the antifuse.

10. The system of claim 9 wherein the control logic is operable to program the plurality of antifuses without requiring removal of the program voltage at the terminal.

* * * * *

UNITED STATES PATENT AND TRADEMARK OFFICE
CERTIFICATE OF CORRECTION

| | | |
|---|---|---|
| PATENT NO. | : 7,915,916 B2 | Page 1 of 1 |
| APPLICATION NO. | : 11/421614 | |
| DATED | : March 29, 2011 | |
| INVENTOR(S) | : William J. Wilcox et al. | |

It is certified that error appears in the above-identified patent and that said Letters Patent is hereby corrected as shown below:

On the Title Page, Item (73), in "Assignee", line 1, delete "Bosie," and insert -- Boise, --, therefor.

In column 8, line 7, in Claim 1, delete "Signals" and insert -- signals --, therefor.

Signed and Sealed this
Thirty-first Day of May, 2011

David J. Kappos
*Director of the United States Patent and Trademark Office*